United States Patent
Onodera

(10) Patent No.: US 7,714,404 B2
(45) Date of Patent: May 11, 2010

(54) SOLID-STATE IMAGING DEVICE

(75) Inventor: Tatsuo Onodera, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/204,518

(22) Filed: Sep. 4, 2008

(65) Prior Publication Data

US 2009/0065884 A1   Mar. 12, 2009

(30) Foreign Application Priority Data

Sep. 6, 2007   (JP) .......................... P2007-231934

(51) Int. Cl.
*H01L 21/00* (2006.01)
(52) U.S. Cl. .................. 257/435; 257/428; 257/431; 257/432; 257/E31.122
(58) Field of Classification Search .................. 257/428, 257/431, 432, 435, E31.122
See application file for complete search history.

(56) References Cited

U.S. PATENT DOCUMENTS

2006/0237722 A1* 10/2006 Matsuda ...................... 257/59

2007/0252183 A1* 11/2007 Ishida et al. ................ 257/292

FOREIGN PATENT DOCUMENTS

| JP | 2003-258234 A | 9/2003 |
| JP | 2005-109021 A | 4/2005 |
| JP | 2007221560 A * | 8/2007 |

\* cited by examiner

*Primary Examiner*—Thanh V Pham
*Assistant Examiner*—Marvin Payen
(74) *Attorney, Agent, or Firm*—Birch, Stewart, Kolasch & Birch, LLP.

(57) ABSTRACT

A solid-state imaging device is provided and includes: a semiconductor substrate; a plurality of photoelectric conversion elements arranged in a two-dimensional array in a surface portion of the semiconductor substrate; a conductive light shielding film above the surface portion, the conductive light shielding film having openings at a light-incident side of the respective photoelectric conversion elements; a connection pad formed in the semiconductor substrate and to be applied with a voltage from outside the solid-state imaging device; and a wiring that connects the connection pad and the conductive light shielding film, wherein the wiring has a wiring structure having a time constant smaller than that of one linear wiring.

4 Claims, 5 Drawing Sheets

SOLID-STATE IMAGING DEVICE

This application is based on and claims priority under 35 U.S.C. §119 from Japanese Patent Application No. 2007-231934 filed Sep. 6, 2007, the entire disclosure of which is herein incorporated by reference.

BACKGROUND OF THE INVENTION

1. Field of the Invention

The present invention relates to a solid-state imaging device, and more particularly, a solid-state imaging device capable of improving characteristics.

2. Description of Related Art

FIG. 4 is a schematic surface view of a CCD solid-state imaging device. This solid-state imaging device 1 includes: a plurality of photoelectric conversion elements (photodiodes: pixels) 2 formed by being arranged in a two-dimensional array in a surface portion of a semiconductor substrate; a vertical charge transfer path (VCCD) 3 formed along each pixel array; a horizontal charge transfer path (HCCD) 4 formed along an end portion in the transferring direction of each vertical charge transfer path; and an amplifier 5 provided at an output end portion of the horizontal charge transfer path 4, for outputting, as an imaging signal, a voltage signal according to the charge amount of a signal charge being transferred.

FIG. 5 is a schematic sectional view of a section along a line V-V of FIG. 4, that is, a pixel part. A photodiode (pixel) is constituted by an n-region 12 (to which the pixel 2 of FIG. 1 corresponds) being formed in a p-well layer 11 of the semiconductor substrate, and on the topmost surface of the n-region 12, a high-density p-layer 13 for dark current suppression is formed.

On both sides of the pixel 2 (n-region 12), formed are n-regions 3a that form buried channels of the vertical charge transfer paths 3, and a high-density p-layer 14 is provided under the n-region 3a. In the illustrated solid-state imaging device, due to a structure where an accumulated charge in the n-region 12 is read out to the vertical charge transfer path 3 on the left side, a high-density p-region 15 to serve as a channel stop is provided between the n-region 12 and the n-region 3a on the right side.

On the buried channel 3a of the vertical charge transfer path 3, a transfer electrode film 3b is formed via an insulating layer. On a light receiving surface of the semiconductor substrate surface portion, a conductive light shielding film 16 such as an aluminum film or a tungsten film is formed. In this light shielding film 16, an opening 16a is provided at a position above each n-region 12. A flattening layer 17 is stacked on the light shielding film 16, and at a position thereon corresponding to each n-region 12, a color filter 18 and a microlens 19 are provided.

Various voltages are applied to the light shielding film 16. For example, a plus voltage is applied when reading out the accumulated charge in n-region 12 to the adjacent buried channel 3a. Moreover, as a result of a minus voltage being applied on occasions other than readout, blooming and smear characteristics are improved.

For thus applying various voltages to the light shielding film 16, in the example shown in FIG. 4, one of the connection pads 20 provided in a peripheral portion of the solid-state imaging device 1 and the light shielding surface 16 are electrically connected by wiring 21, and as a result of a voltage being applied to the connection pad 20 from the outside, applied voltage control of the light shielding film 16 is performed.

Also, documents relating to techniques for applying a predetermined voltage such as a read voltage to a light shielding film include, for example, JP-A-2003-258234 and JP-A-2005-109021.

Miniaturization of recent solid-state imaging devices has advanced together with the increasing number of pixels, and thinning of the wiring 21 shown in FIG. 4 has also advanced. However, when the wiring 21 is thinned, a time constant of the wiring 21 is increased, so that a read pulse to be applied to the light shielding film 16 has a rounded pulse waveform.

In other words, sufficient effects as being a readout gate may not be obtained. Moreover, since the amount of current flowing through the wiring 21 is increased, reliability of an imaging device declines.

Furthermore, it can be considered that a voltage to be applied to the light shielding film 16 having a large area becomes nonuniform in the light shielding film, that is, in a pixel region, and there is a possibility that a read voltage and characteristics of, blooming, smear, and the like vary in a plane.

SUMMARY OF THE INVENTION

An object of the present invention is to provide a solid-state imaging device capable of improving reliability and characteristics of the device.

According to an aspect of the invention, there is provided a solid-state imaging device including: a semiconductor substrate; a plurality of photoelectric conversion elements arranged in a two-dimensional array in a surface portion of the semiconductor substrate; a conductive light shielding film above the surface portion, the conductive light shielding film having openings at a light-incident side of the respective photoelectric conversion elements; a connection pad formed in the semiconductor substrate and to be applied with a voltage from outside the solid-state imaging device; and a wiring that connects the connection pad and the conductive light shielding film, wherein the wiring has a wiring structure having a time constant smaller than that of one linear wiring.

In the solid-state imaging device, the wiring structure may include: a first wiring having a frame shape and disposed in a peripheral portion of the conductive light shielding film; a second wiring that connects the first wiring and the connection pad; and a plurality of third wirings that connect a plurality of connecting points disposed around the conductive light shielding film and the first wiring.

In the solid-state imaging device, the plurality of connecting points may be disposed uniformly in the peripheral portion of the conductive light shielding film.

In the solid-state imaging device, the wiring structure may have a sheet form contacting the conductive light shielding film along one side thereof.

In the solid-state imaging device, the wiring having the sheet form may have a structure to contact one side of the conductive light shielding film over an entire length of one side thereof.

In the solid-state imaging device, the connection pad may include a plurality of connection pads, and the wiring structure may include a plurality of wirings that connect the respective connection pads and the conductive light shielding film.

In the solid-state imaging device, a plurality of connecting points of the conductive light shielding film to be connected to the plurality of connection pads may be disposed in a discrete manner in a peripheral portion of the conductive light shielding film.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

According to an exemplary embodiment of the present invention, since a voltage can be uniformly applied to the conductive light shielding film, various characteristics and the like are improved, and reliability of the imaging device is improved.

Hereinafter, exemplary embodiments of the present invention will be described with reference to the drawings.

Figure 1:
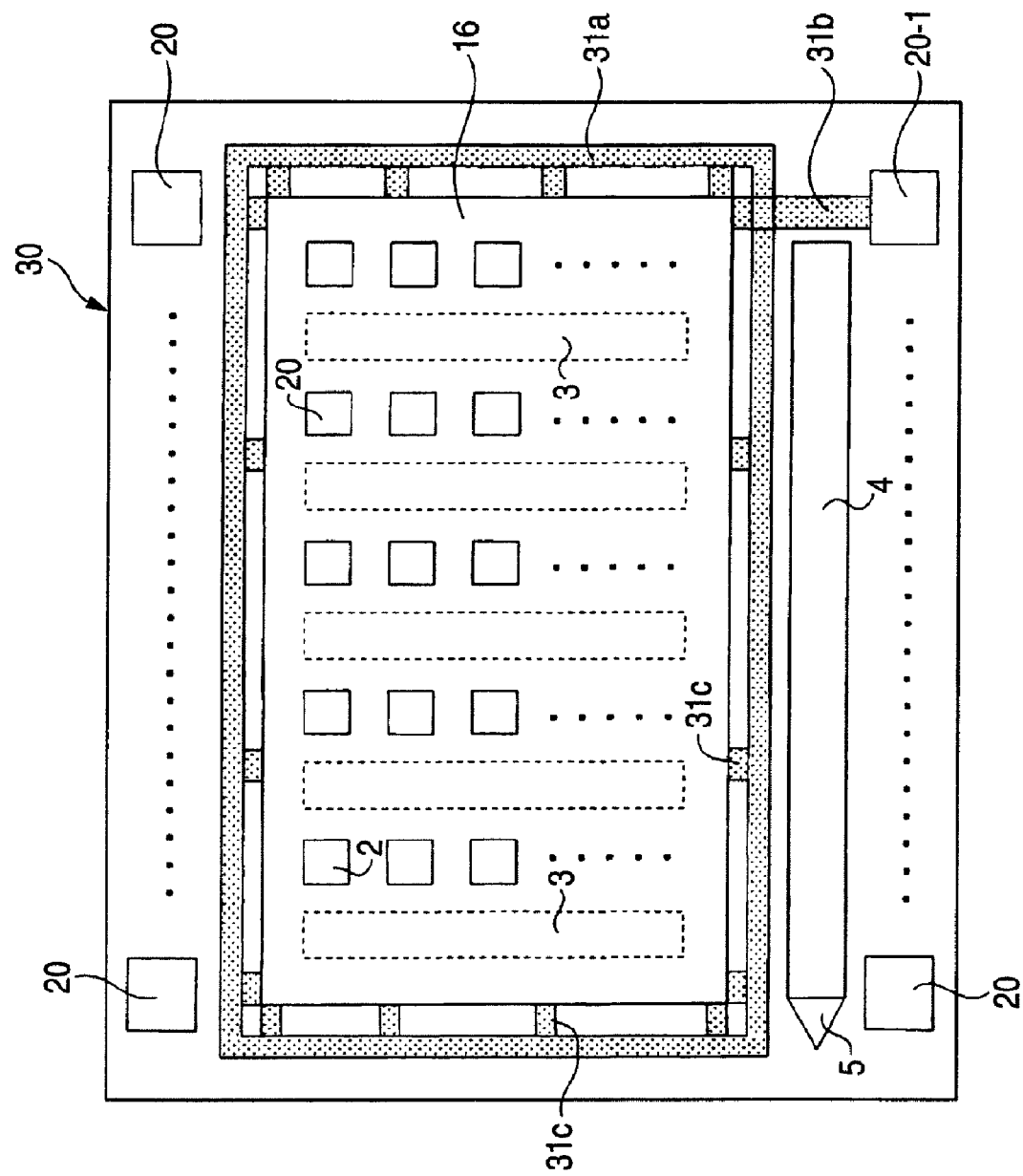
FIG. 1 is a schematic surface view of a CCD solid-state imaging device according to a first exemplary embodiment of the present invention.
Figure 4:
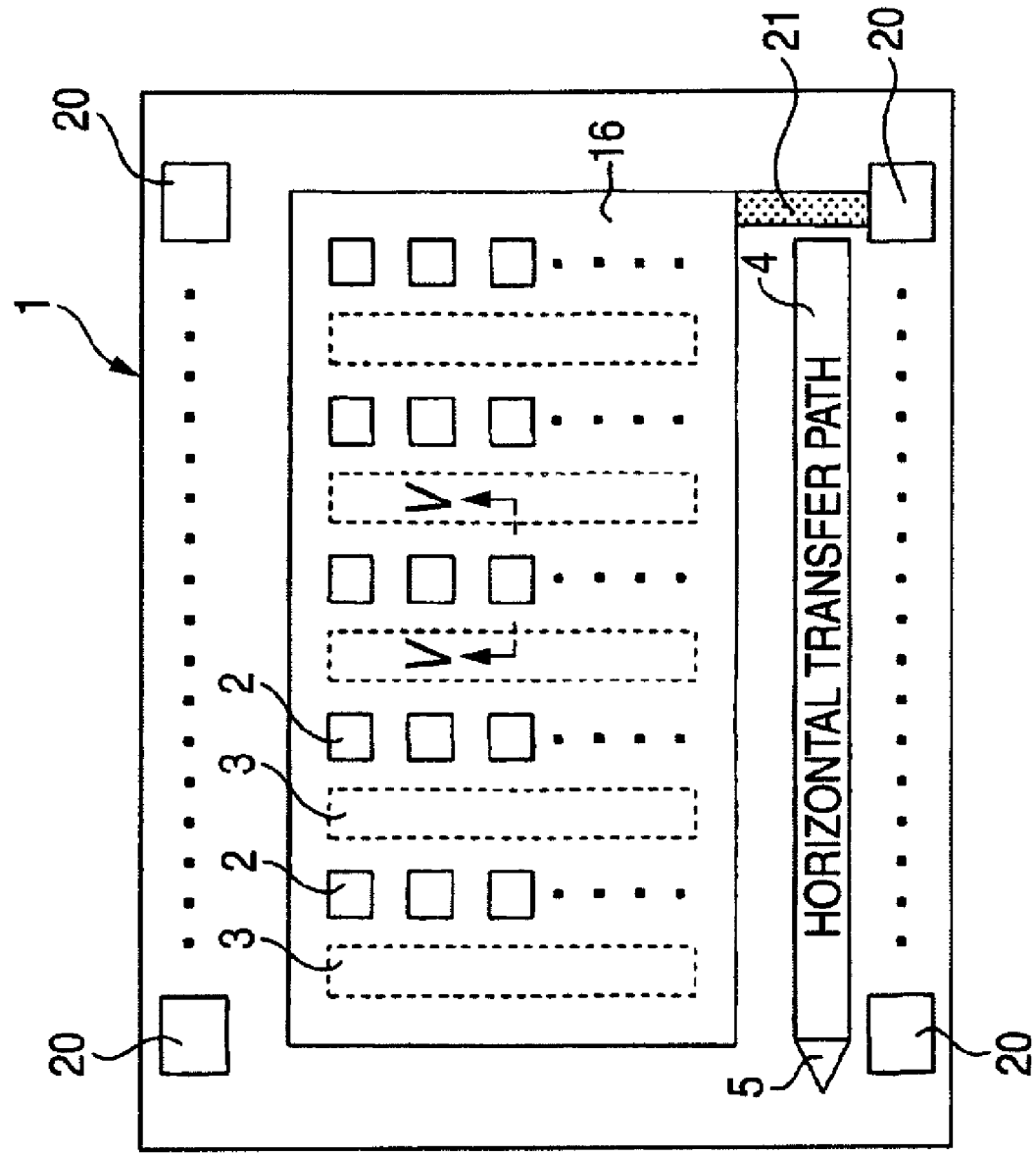
FIG. 4 is a schematic surface view of a CCD solid-state imaging device.
Figure 5:
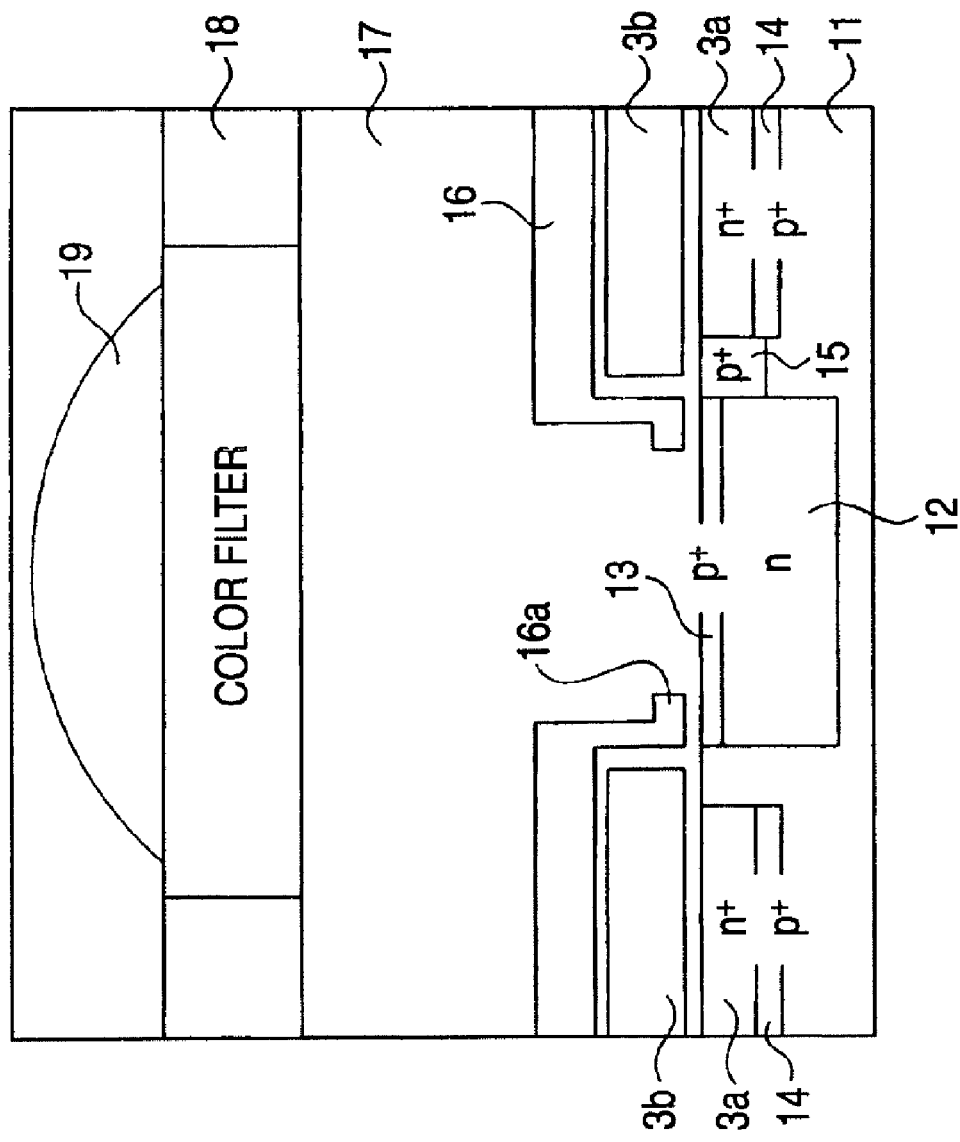
FIG. 5 is a schematic sectional view along a line V-V of FIG. 4.

FIG. 1 is a schematic surface view of a CCD solid-state imaging device according to a first exemplary embodiment of the present invention. Since a sectional configuration of a pixel part of the CCD solid-state imaging device 30 is the same as that of FIG. 5, description thereof will be omitted. Moreover, the same components between the CCD solid-state imaging device 30 and the CCD solid-state imaging device 1 described in FIG. 4 are denoted by the same symbols, and description thereof will be omitted.

In the CCD solid-state imaging device 30 according to the present embodiment, one connection pad 20-1 out of connection pads 20 provided in a peripheral portion of the imaging device 30 is connected to a light shielding film 16, while overall, connecting points at four positions in each side of the rectangular light shielding film 16, a total of 16 positions and the connection pad 20-1 are connected by wiring.

This wiring connection is carried out by a wiring 31a in a rectangular frame shape surrounding the light shielding film 16, a wiring 31b that connects the wiring 31a and the connection pad 20-1, and a total of 16 short wirings 31c that connect the wiring 31a and the above-mentioned 16 connecting points of the light shielding film 16.

In this manner, by providing a plurality of wirings to apply a voltage to the light shielding film 16 and arranging the respective wirings 31c uniformly in good balance around the light shielding film 16, that is, in the periphery of the pixel region (light receiving region), a total time constant of the wirings is reduced. Therefore, it becomes possible to apply a uniform voltage even to the light shielding film 16 having a large area, and in-plane variations of the read voltage, blooming characteristics, and smear characteristics are eliminated, so that reliability of the imaging device is improved.

Figure 2:
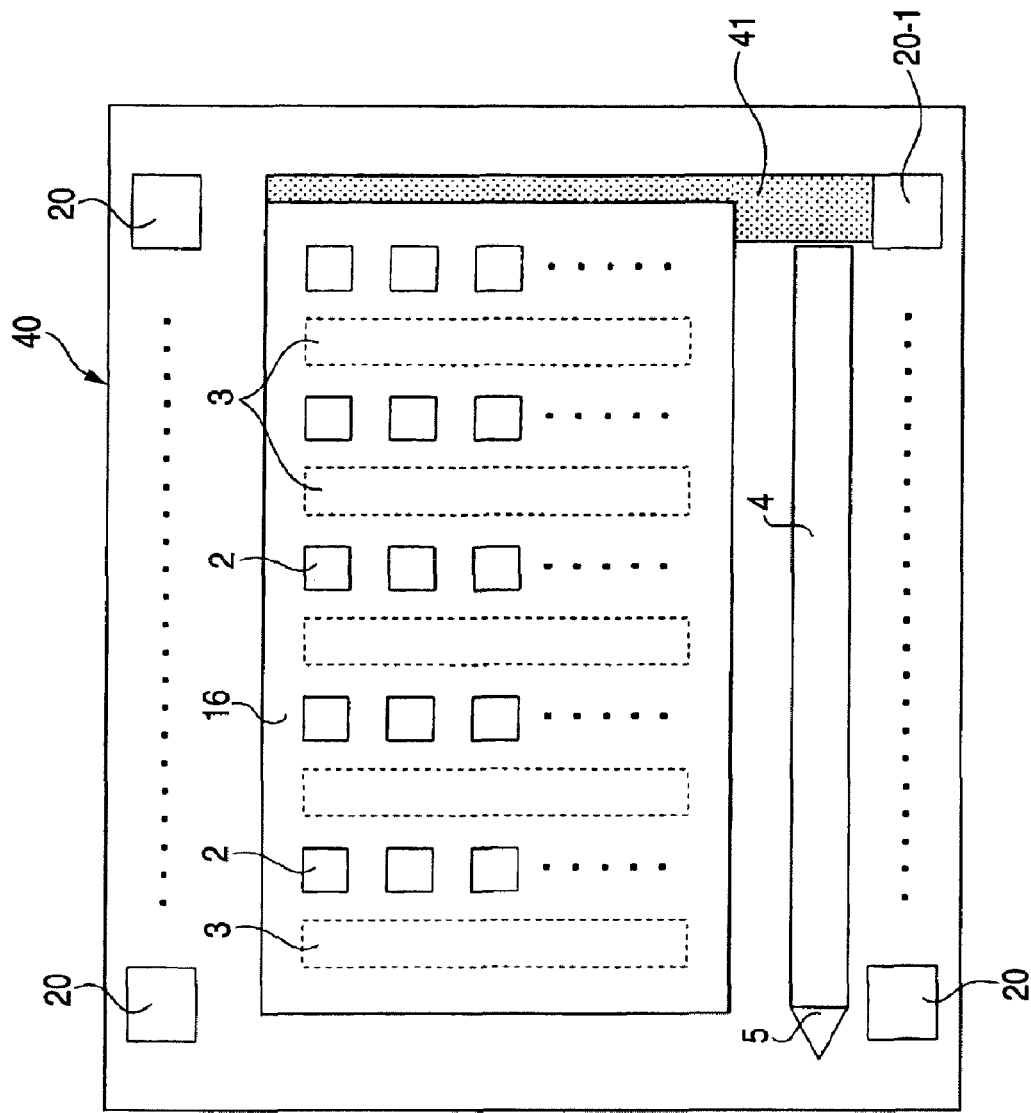
FIG. 2 is a schematic surface view of a CCD solid-state imaging device according to a second exemplary embodiment of the present invention.

FIG. 2 is a schematic surface view of a CCD solid-state imaging device according to a second exemplary embodiment of the present invention. The CCD solid-state imaging device 40 according to the present embodiment is almost the same in configuration as the CCD solid-state imaging device 30 shown in FIG. 1, and differs in only the point of a wiring connection for applying a voltage to a light shielding film 16.

In the CCD solid-state imaging device 40 of the present embodiment, a connection of one connection pad 20-1 and the light shielding film 16 is carried out by one wiring 41. However, a difference from the structure described in FIG. 4 exists in using, as the wiring 41, a wiring having a pattern of a large ratio of "width W/length L," that is, a sheet-like wiring 41. This makes a time constant of the wiring 41 smaller than that of the wiring 21 in FIG. 4, improves various characteristics and the like, and improves reliability of the imaging device as with the first embodiment.

Furthermore, in the wiring 41 of the present embodiment, a contact area between the wiring 41 and the light shielding film 16 is increased. In the illustrated example, the light shielding film 16 is connected to the wiring 41 over the entire length of one side thereof. This further improves the various characteristics and the like, and also further improves reliability of the imaging device.

Figure 3:
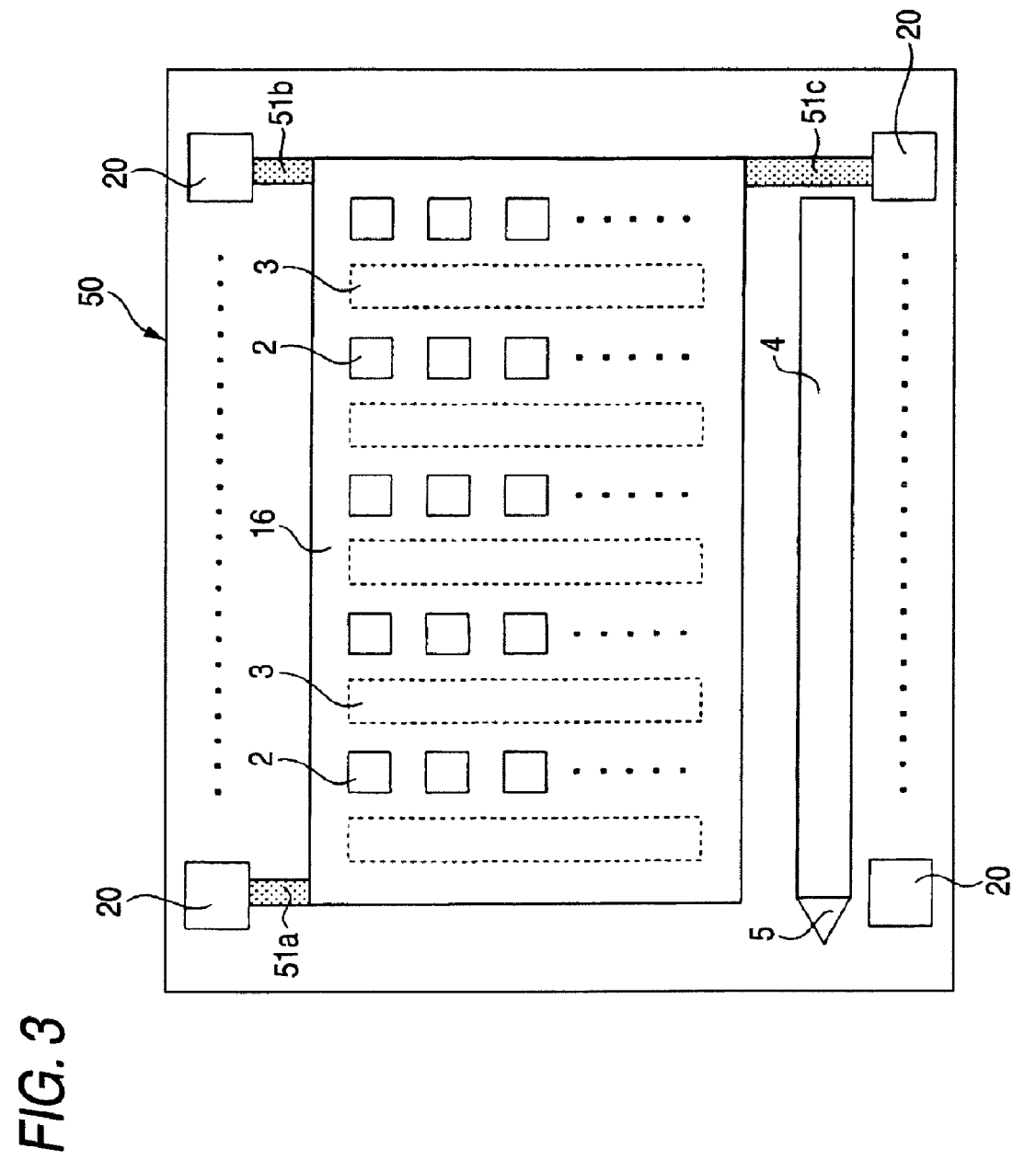
FIG. 3 is a schematic surface view of a CCD solid-state imaging device according to a third exemplary embodiment of the present invention.

FIG. 3 is a schematic surface view of a CCD solid-state imaging device according to a third exemplary embodiment of the present invention. The CCD solid-state imaging device 50 according to the present embodiment is almost the same in configuration as the CCD solid-state imaging device 30 shown in FIG. 1, and differs in only the point of a wiring connection for applying a voltage to a light shielding film 16.

In the CCD solid-state imaging device 50 of the present embodiment, of connection pads 20 provided in a peripheral portion of the imaging device 50, three connection pads 20 distant from each other are used as connection pads for applying a voltage to the light shielding film 16, and these are connected to the light shielding film 16 by wirings 51a, 51b, and 51c, respectively.

In the illustrated example, although the connection pad 20 in the vicinity of the portion where an output amplifier 5 is provided is not used as a connection pad for applying a voltage to the light shielding film 16, by also connecting the connection pad 20 to the light shielding film 16 if a wiring connection between the connection pad 20 and the light shielding film 16 is structurally possible, it further becomes possible to apply a voltage to the light shielding film 16 in good balance.

However, even with the configuration of FIG. 3 as well, an application voltage to the light shielding film can be uniformized, so that as in the first and second embodiments, it becomes possible to improve various characteristics and the like and reliability of the imaging device.

As has been described above, according to the above-mentioned embodiments, a time constant of the wiring to apply a voltage to the light shielding film can be made smaller than that when a one linear connection wiring of a connection pad for applying a voltage and a light shielding film is provided, and in-plane variations of the read voltage and various characteristics such as blooming characteristics and smear characteristics are eliminated, so that reliability of the imaging device is improved.

Although descriptions have been given of CCD solid-state imaging devices, the above-mentioned embodiment can also be applied without change to another type of solid-state imaging device such as a CMOS image sensor, as long as this has a light shielding film and applies a voltage to the light shielding film.

A solid-state imaging device according to an exemplary embodiment of the present invention can stably apply a voltage to a light shielding film, and a highly-reliable imaging device can be obtained, and thus an exemplary embodiment of the present invention is useful when being applied to a solid-state imaging device to be mounted on a digital camera and the like.

What is claimed is:

1. A solid-state imaging device comprising:

a semiconductor substrate;

a plurality of photoelectric conversion elements arranged in a two-dimensional array in a surface portion of the semiconductor substrate;

a conductive light shielding film above the surface portion, the conductive light shielding film having openings at a light-incident side of the respective photoelectric conversion elements;

a connection pad formed in the semiconductor substrate and to be applied with a voltage from outside the solid-state imaging device; and a wiring that connects the connection pad and the conductive light shielding film, wherein the wiring has a wiring structure having a time constant smaller than that of one linear wiring, and wherein the wiring structure includes:

a first wiring having a frame shape and disposed in a peripheral portion of the conductive light shielding film;

a second wiring that connects the first wiring and the connection pad; and a plurality of third wirings that connect a plurality of connecting points disposed around the conductive light shielding film and the first wiring.

2. The solid-state imaging device according to claim 1, wherein the plurality of connecting points are disposed uniformly in the peripheral portion of the conductive light shielding film.

3. The solid-state imaging device according to claim 1, wherein the connection pad includes a plurality of connection pads, and the wiring structure includes a plurality of wirings that connect the respective connection pads and the conductive light shielding film.

4. The solid-state imaging device according to claim 3, wherein a plurality of connecting points of the conductive light shielding film to be connected to the plurality of connection pads are disposed in a discrete manner in a peripheral portion of the conductive light shielding film.

* * * * *